US012690363B2

(12) United States Patent
Yuan

(10) Patent No.: US 12,690,363 B2
(45) Date of Patent: Jul. 21, 2026

(54) DISPLAY PANEL AND REPAIRING METHOD OF DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Song Yuan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 808 days.

(21) Appl. No.: 17/756,650

(22) PCT Filed: Apr. 13, 2022

(86) PCT No.: PCT/CN2022/086600
§ 371 (c)(1),
(2) Date: May 29, 2022

(87) PCT Pub. No.: WO2023/173520
PCT Pub. Date: Sep. 21, 2023

(65) Prior Publication Data
US 2024/0164176 A1 May 16, 2024

(30) Foreign Application Priority Data
Mar. 16, 2022 (CN) .......................... 202210261979.2

(51) Int. Cl.
*H10K 59/12* (2023.01)
*H10K 59/80* (2023.01)

(52) U.S. Cl.
CPC ... *H10K 59/80516* (2023.02); *H10K 59/1201* (2023.02)

(58) Field of Classification Search
CPC ....... H01L 25/16; H01L 25/167; H01L 25/18; H01L 25/075; H01L 25/0753;
(Continued)

(56) References Cited

U.S. PATENT DOCUMENTS

2013/0037838 A1* 2/2013 Speier .................... H01L 22/10
                                                                    118/620
2017/0033349 A1* 2/2017 Dai .................... H01M 50/191
(Continued)

FOREIGN PATENT DOCUMENTS

CN        105161517 A      12/2015
CN        110133925 A       8/2019
(Continued)

OTHER PUBLICATIONS

International Search Report in International application No. PCT/CN2022/086600, mailed on Jul. 29, 2022.
(Continued)

*Primary Examiner* — Moin M Rahman
(74) *Attorney, Agent, or Firm* — PV IP PC; Christopher S. Ruprecht; Wei Te Chung

(57) ABSTRACT

A display panel and a repairing method of the display panel are disclosed in an embodiment of the present application; after a first electrode is manufactured, a first extending electrode and a second extending electrode extending along a thickness direction of an array substrate are formed on two ends of a residual electrode, respectively; a first signal wiring and a second signal wiring are supplied with electrical signals, respectively, making the residual electrode between the first extending electrode and the second extend-
(Continued)

ing electrode melt and disconnect, which can solve a short-circuit problem caused by the residual electrode.

11 Claims, 4 Drawing Sheets

(58) Field of Classification Search
CPC ..... H01L 27/153; H01L 27/156; H01L 24/75; H01L 24/98; H01L 2221/68322; H01L 2221/68354; H01L 2224/75822; H01L 2224/7598; H01L 2924/12041; H01L 21/6835; H01L 24/95; H01L 2224/73204; H10K 59/80516; H10K 59/1201; H10K 59/131; H10K 59/12; H10K 50/805; H10K 71/00; H10K 10/46–491; H10K 59/1213; H10K 59/124; H10K 59/122; H10K 50/30; H10K 19/10; H10K 59/125; H10K 10/481–482; H10K 10/464; H10K 10/466; H10K 10/84; H10K 77/111; H10K 50/852; H10K 50/856; H10K 50/8445; H10K 50/85; H10K 59/10; H10K 59/129; H10K 2101/00; H10K 2102/311; H10K 2102/361; H10K 50/11; H10K 50/15; H10K 50/16; H10K 50/171; H10K 2101/30; H10K 2101/40; H10K 2102/351; H10K 59/35; H10K 50/156; H10H 20/01; H10H 20/821; H10H 20/857; H10H 20/8312; H10H 20/814; H10H 20/032; H10H 20/0364; H10H 20/0363; H10H 20/855; H10H 20/819; H10H 20/856; H10H 20/82; H10H 20/831; H10D 30/67–6759; H10D 30/031–0327; H10D 86/021–0251; H10D 30/6755; H10D 86/423; H10D 86/60; H10D 86/0221; H10D 30/6729; H10D 30/6731; H10D 30/6745; H10D 86/425; H10D 86/481; H10D 86/441; H10D 86/40; H10D 30/6728; G02F 1/133305; G02F 1/133388; G02F 1/13452; G02F 1/136254; G02F 2201/50; G02F 2202/28; Y02E 10/549; G09G 2300/0426; B60K 37/02; B60K 2370/1523; B60K 2370/331; B60K 2370/52; B60R 1/00
See application file for complete search history.

(56) References Cited

U.S. PATENT DOCUMENTS

| | | | | |
|---|---|---|---|---|
| 2021/0126160 | A1* | 4/2021 | Andrews | H01L 33/50 |
| 2021/0288231 | A1* | 9/2021 | Li | H10H 20/855 |
| 2023/0045618 | A1* | 2/2023 | Kim | H10H 20/832 |

FOREIGN PATENT DOCUMENTS

| | | |
|---|---|---|
| CN | 110459578 A | 11/2019 |
| CN | 211479575 U | 9/2020 |
| CN | 113707694 A | 11/2021 |
| JP | 2003233329 A | 8/2003 |

OTHER PUBLICATIONS

Written Opinion of the International Search Authority in International application No. PCT/CN2022/086600,mailed on Jul. 29, 2022.

* cited by examiner

| | |
|---|---|
| providing an array substrate, wherein the array substrate comprises a first signal wiring and a second signal wiring; | Step S100 |
| forming a plurality of first electrodes of a plurality of light-emitting devices disposed in a plurality of arrays on the array substrate, wherein the first electrodes comprise a first sub-electrode and a second sub-electrode adjacent to each other; a residual electrode is generated between the first sub-electrode and the second sub-electrode, and the residual electrode is connected between the first sub-electrode and the second sub-electrode; | Step S200 |
| irradiating laser from one side of the array substrate, wherein a first through hole and a second through hole are defined respectively at corresponding parts of two ends of the residual electrode; the first through hole is defined between the first sub-electrode and the first signal wiring, and the second through hole is defined between the second sub-electrode and the second signal wiring; | Step S300 |
| injecting a conductive material into the first through hole and the second through hole to form an extending electrode, wherein the extending electrode comprises a first extending electrode and a second extending electrode; the first extending electrode is connected to the first sub-electrode and the first signal wiring, and the second extending electrode is connected to the second sub-electrode and the second signal wiring; | Step S400 |
| supplying electrical signals to the first signal wiring and the second signal wiring, respectively, such that the residual electrode between the first extending electrode and the second extending electrode is melted and disconnected; | Step S500 |
| irradiating the first extending electrode and the second extending electrode with laser, wherein the first extending electrode is at least partially melted to disconnect the first sub-electrode and the first signal wiring, and the second extending electrode is at least partially melted to disconnect the second sub-electrode and the second signal wiring. | Step S600 |

FIG. 2

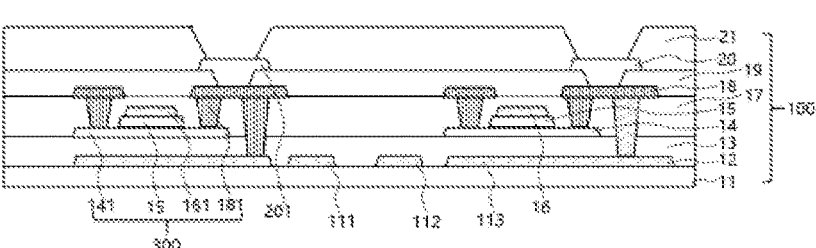

FIG. 3

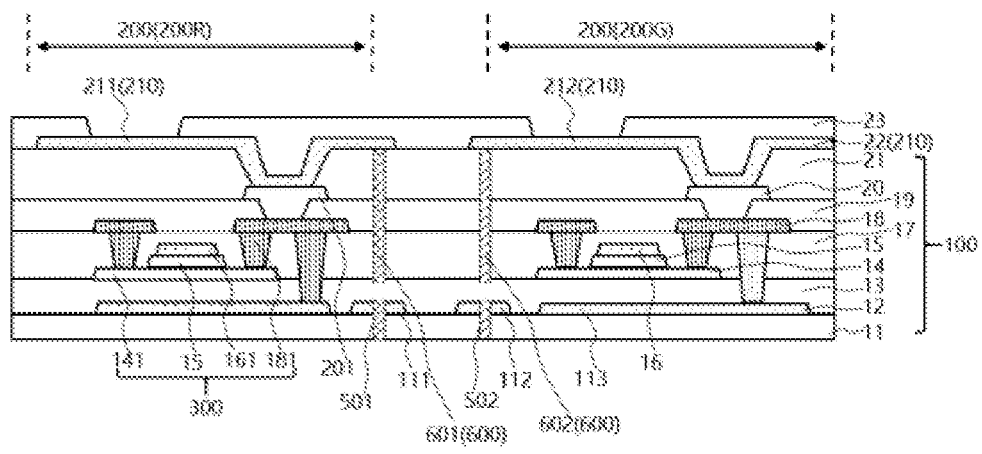

FIG. 10 irradiating the first extending electrode and the second extending electrode with laser, wherein the first extending electrode is at least partially melted to disconnect the first sub-electrode and the first signal wiring, and the second extending electrode is at least partially melted to disconnect the second sub-electrode and the second signal wiring;    —— Step S600 forming a light-emitting material layer on the first electrodes, forming a second electrode of the light-emitting devices on the light-emitting material layer, and forming a package layer on the second electrode    — Step S700

FIG. 11

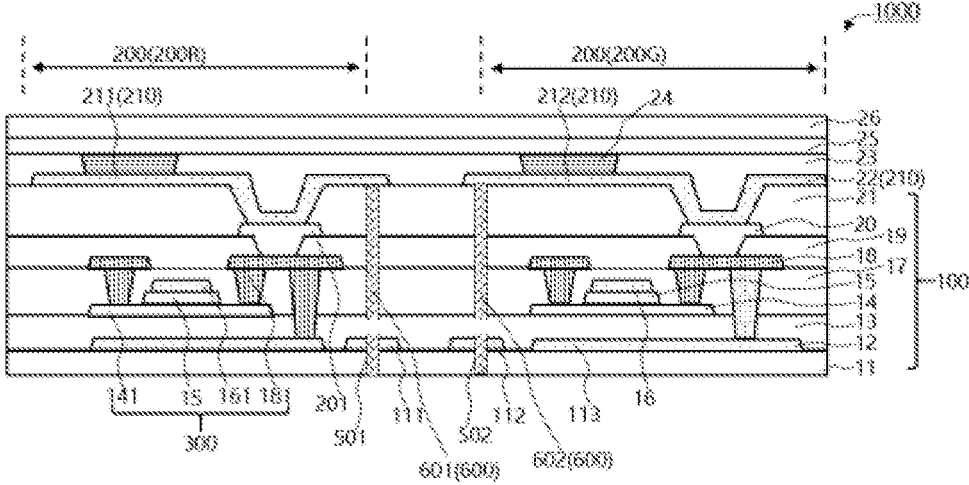

FIG. 12

DISPLAY PANEL AND REPAIRING METHOD OF DISPLAY PANEL

FIELD OF DISCLOSURE

The present application relates to a technical field of displays, and specifically to a display panel and a repairing method of the display panel.

BACKGROUND OF DISCLOSURE

Organic light-emitting display panels (OLEDs) have been widely used in people's lives, such as display screens of mobile phones and computers. With development of display technology, resolution of the organic light-emitting display panels is getting higher and higher (high PPI). As shown in FIG. 1, FIG. 1 illustrates residual electrodes 213 existing between adjacent first electrodes 210 of adjacent light-emitting devices in the prior art. The first electrode 210 is usually an anode of the light-emitting device. The resolution of the organic light-emitting display panels is getting higher and higher, and a distance between the adjacent first electrodes 210 of the adjacent light-emitting devices is smaller and smaller; the residual electrodes 213, for example, caused by etching residues, are prone to appear in a manufacturing process of the first electrodes 210, and short-circuit occurs between the adjacent first electrodes 210. Especially when the adjacent first electrodes 210 correspond to light-emitting devices of different colors, poor display easily occurs, which reduces a yield of the organic light-emitting display panels. For example, a display panel includes a plurality of light-emitting devices 200, the plurality of light-emitting devices 200 comprise a red light-emitting device 200R, a green light-emitting device 200G, and a blue light-emitting device 200B; the residual electrode 213 exists between the first electrode 210 of the red light-emitting device 200R and the first electrode 210 of the green light-emitting device 200G, resulting in the short-circuit; so when the red light-emitting device 200R emits light, the green light-emitting device 200G also emits light, so that the display panel cannot display required colors. In existing repairing technology, the residual electrode 213 is directly irradiated by laser, so that the residual electrode 213 is melted and disconnected. However, when the residual electrode 213 is melted and disconnected, a large number of particles is generated; the particles may even splash to various parts of the first electrode 210, so that thicknesses of subsequent film layers are not uniform, resulting in a decrease in display quality.

Therefore, it is necessary to propose a display panel and a repairing method of the display panel to solve a short-circuit problem caused by the residual electrodes between the first electrodes of the adjacent light-emitting devices, as well as problems of a yield decline and a display quality decline of the display panels.

Technical Problem

A display panel and a repairing method of the display panel are provided by embodiments of the present application, so as to solve a short-circuit problem caused by residual electrodes between first electrodes of adjacent light-emitting devices, as well as problems of a yield decline and a display quality decline of display panels.

SUMMARY OF DISCLOSURE

A display panel, comprising:
an array substrate;

a plurality of light-emitting devices disposed in an array on the array substrate, the light-emitting devices comprising a first electrode and a second electrode, the second electrode disposed on one side of the first electrode away from the array substrate;

wherein the array substrate comprises an extending electrode, and at least one of the first electrodes is connected to the extending electrode; the extending electrode is disposed along a thickness direction of the array substrate and extends in the array substrate, and one end of the extending electrode is floating.

Optionally, in some embodiments of the present application, the extending electrode comprises a first extending electrode and a second extending electrode; the first extending electrode and the second extending electrode are disposed between at least two adjacent first electrodes, and the first extending electrode and the second extending electrode are connected to adjacent two of the first electrodes, respectively.

Optionally, in some embodiments of the present application, the first electrode connected to the first extending electrode and the first electrode connected to the second extending electrode correspond to the light-emitting devices of different colors, respectively.

Optionally, in some embodiments of the present application, a melting point of a material of the extending electrode is greater than a melting point of a material of the first electrodes.

Optionally, in some embodiments of the present application, the material of the extending electrode comprises any one of copper, aluminum, or graphene.

Correspondingly, a repairing method of the display panel is further provided by the embodiments of the present application, comprising following steps:

step S100: providing an array substrate, wherein the array substrate comprises a first signal wiring and a second signal wiring;

step S200: forming a plurality of first electrodes of a plurality of light-emitting devices disposed in a plurality of arrays on the array substrate, wherein the first electrodes comprise a first sub-electrode and a second sub-electrode adjacent to each other; a residual electrode is generated between the first sub-electrode and the second sub-electrode, and the residual electrode is connected between the first sub-electrode and the second sub-electrode;

step S300: irradiating laser from one side of the array substrate, wherein a first through hole and a second through hole are defined respectively at corresponding parts of two ends of the residual electrode; the first through hole is defined between the first sub-electrode and the first signal wiring, and the second through hole is defined between the second sub-electrode and the second signal wiring;

step S400: injecting a conductive material into the first through hole and the second through hole to form an extending electrode, wherein the extending electrode comprises a first extending electrode and a second extending electrode; the first extending electrode is connected to the first sub-electrode and the first signal wiring, and the second extending electrode is connected to the second sub-electrode and the second signal wiring;

step S500: supplying electrical signals to the first signal wiring and the second signal wiring, respectively, such that the residual electrode between the first extending electrode and the second extending electrode is melted and disconnected;

step S600: irradiating the first extending electrode and the second extending electrode with laser, wherein the first extending electrode is at least partially melted to disconnect the first sub-electrode and the first signal wiring, and the second extending electrode is at least partially melted to disconnect the second sub-electrode and the second signal wiring.

Optionally, in some embodiments of the present application, in the step S400, a melting point of a material of the extending electrode is greater than a melting point of a material of the first electrodes.

Optionally, in some embodiments of the present application, the material of the extending electrode comprises any one of copper, aluminum, or graphene.

Optionally, in some embodiments of the present application, in the step S500, a voltage difference between the first signal wiring and the second signal wiring is 15V to 30V.

Optionally, in some embodiments of the present application, the first signal wiring is one of a power signal wiring or a second cathode signal wiring, the second signal wiring is another of the power signal wiring and the second cathode signal wiring.

Optionally, in some embodiments of the present application, after the step S600, the method further comprises following step:

step S700: forming a light-emitting material layer on the first electrodes, forming a second electrode of the light-emitting devices on the light-emitting material layer, and forming a package layer on the second electrode.

In embodiments of the present application, a display panel and a repairing method of the display panel are provided. In a manufacturing process of the display panel, after first electrodes are manufactured, the two adjacent first electrodes with a residual electrode are respectively a first sub-electrode and a second sub-electrode; laser is irradiated from one side of an array substrate, and a first through hole and a second through hole are respectively defined at corresponding parts of two ends of the residual electrode; a conductive material is injected into the first through hole and the second through hole to form a first extending electrode and a second extending electrode, respectively. The first extending electrode is connected to the first sub-electrode and a first signal wiring, the second extending electrode is connected to the second sub-electrode and a second signal wiring. The first signal wiring and the second signal wiring are supplied with electrical signals respectively to make the residual electrode between the first extending electrode and the second extending electrode melt and disconnect; then the first extending electrode and the second extending electrode are irradiated with the laser, making the first extending electrode and the second extending electrode melt and disconnect, respectively. At least one first electrode of a repaired display panel is connected to an extending electrode; the extending electrode is disposed along a thickness direction of the array substrate and extends in the array substrate, one end of the extending electrode is floating; the repaired display panel eliminates a short-circuit problem caused by the residual electrodes between the first electrodes of adjacent light-emitting devices. The display panel and the repairing method of the display panel provided by the embodiments of the present application can solve the short-circuit problem caused by the residual electrodes between the first electrodes of the adjacent light-emitting devices, thereby improving a yield of the display panels and improving display quality of the display panels.

BRIEF DESCRIPTION OF DRAWINGS

In order to illustrate technical solutions in embodiments of the present application more clearly, accompanying drawings that need to be used in a description of the embodiments will be briefly introduced as follows. Obviously, the drawings in following description are only some embodiments of the present application. For those skilled in the art, other drawings can also be obtained according to the disclosed drawings without creative efforts.

FIG. 1 is a schematic diagram of residual electrodes existing between first electrodes of adjacent light-emitting devices in the prior art.

FIG. 2 is a schematic flowchart of a repairing method of a display panel provided by an embodiment of the present application.

FIG. 3 is a schematic diagram of a first process of the repairing method of the display panel provided by the embodiment of the present application.

FIG. 10 is a first schematic structural diagram of a repaired display panel provided by the embodiment of the present application.

FIG. 11 is another schematic flowchart of the repairing method of the display panel provided by the embodiment of the present application.

FIG. 12 is a second schematic structural diagram of the repaired display panel provided by the embodiment of the present application.

DETAILED DESCRIPTION OF PREFERRED EMBODIMENTS

Figure 4:
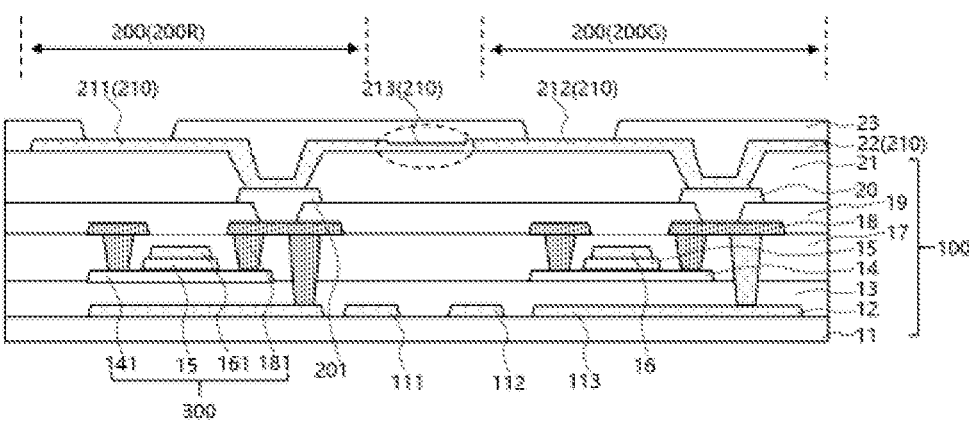
FIG. 4 is a schematic diagram of a second process of the repairing method of the display panel provided by the embodiment of the present application.

The technical solutions in the embodiments of the present application will be clearly and completely described below with reference to the drawings in the embodiments of the present application. Obviously, described embodiments are only a part of the embodiments of the present application, rather than all the embodiments. Based on the embodiments in the present application, all other embodiments obtained by those skilled in the art without creative efforts fall within a protection scope of the present application. In addition, it should be understood that specific embodiments described here are only used to illustrate and explain the present application, but not to limit the present application. In the present application, unless otherwise stated, directional words used such as "upper" and "lower" generally refer to an upper and lower parts of a device in actual use or working state, specifically direction of the drawing in the drawings; and the directional words "inside" and "outside" refer to an outline of the device.

A display panel is provided in an embodiment of the present application, which includes: an array substrate, and a plurality of light-emitting devices disposed in an array on the array substrate; the light-emitting devices comprise a first electrode and a second electrode, the second electrode is disposed on one side of the first electrode away from the array substrate; wherein the array substrate includes an extending electrode, and at least one first electrode is connected to the extending electrode; the extending electrode is disposed along a thickness direction of the array substrate and extends in the array substrate, and one end of the extending electrode is floating.

A display panel and a repairing method of the display panel are provided in embodiments of the present application, which will be described in detail below. It should be noted that a description order of following embodiments is not intended to limit a preferred order of the embodiments.

First Embodiment

Figure 5:
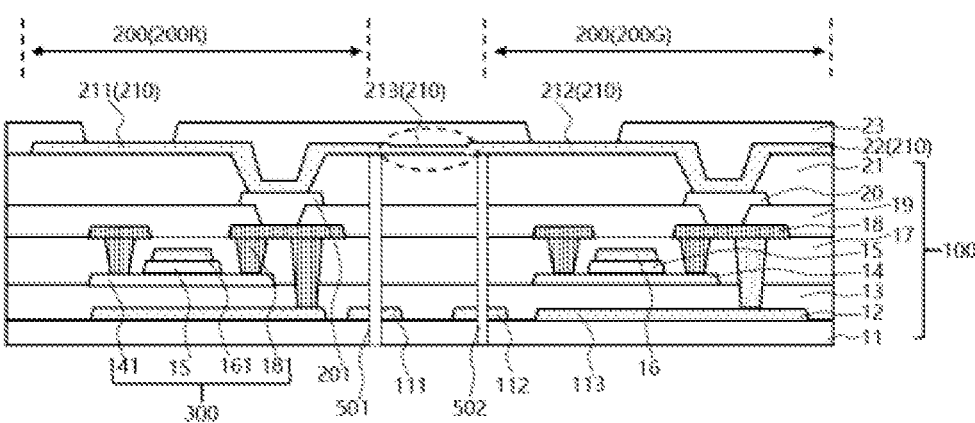
FIG. 5 is a schematic diagram of a third process of the repairing method of the display panel provided by the embodiment of the present application.
Figure 6:
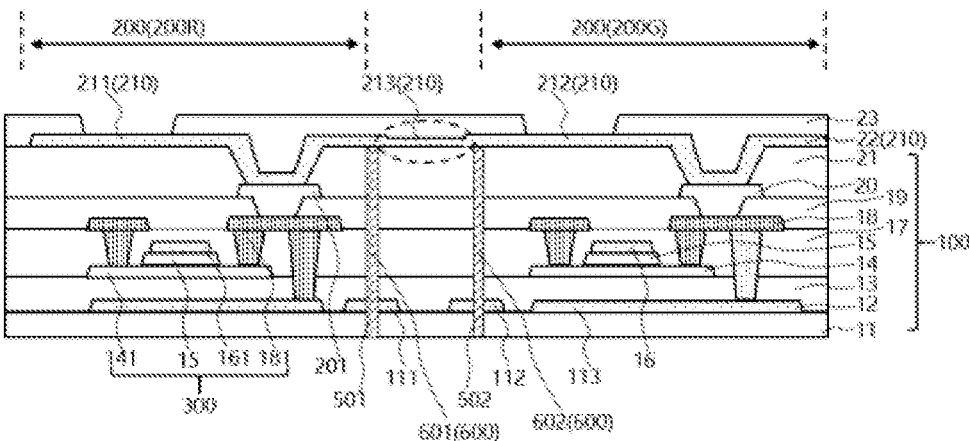
FIG. 6 is a schematic diagram of a fourth process of the repairing method of the display panel provided by the embodiment of the present application.
Figure 7:
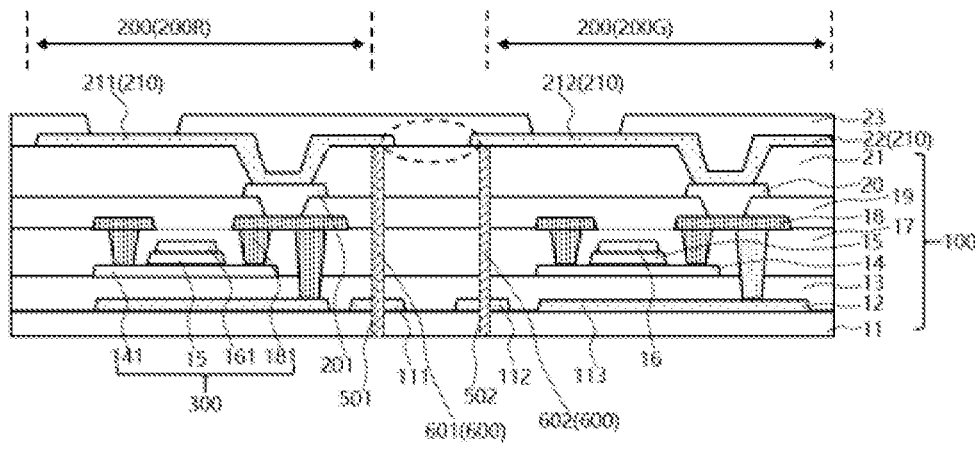
FIG. 7 is a schematic diagram of a fifth process of the repairing method of the display panel provided by the embodiment of the present application.
Figure 8:
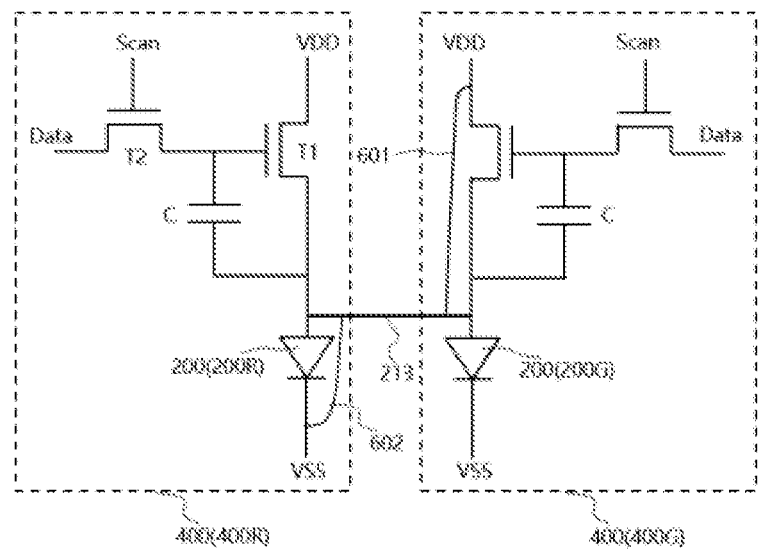
FIG. 8 is a first schematic diagram of a repairing principle of the repairing method of the display panel provided by the embodiment of the present application.
Figure 9:
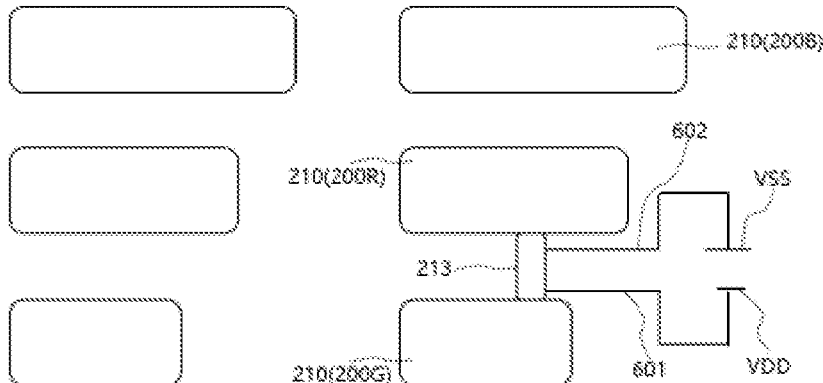
FIG. 9 is a second schematic diagram of the repairing principle of the repairing method of the display panel provided by the embodiment of the present application.

Please refer to FIGS. 2 to 8, FIG. 2 is a schematic flowchart of a repairing method of a display panel provided by an embodiment of the present application. FIG. 3 is a schematic diagram of a first process of the repairing method of the display panel provided by the embodiment of the present application. FIG. 4 is a schematic diagram of a second process of the repairing method of the display panel provided by the embodiment of the present application. FIG. 5 is a schematic diagram of a third process of the repairing method of the display panel provided by the embodiment of the present application. FIG. 6 is a schematic diagram of a fourth process of the repairing method of the display panel provided by the embodiment of the present application. FIG. 7 is a schematic diagram of a fifth process of the repairing method of the display panel provided by the embodiment of the present application. FIG. 8 is a first schematic diagram of a repairing principle of the repairing method of the display panel provided by the embodiment of the present application. FIG. 9 is a second schematic diagram of the repairing principle of the repairing method of the display panel provided by the embodiment of the present application. FIG. 10 is a first schematic structural diagram of a repaired display panel provided by the embodiment of the present application. FIG. 11 is another schematic flowchart of the repairing method of the display panel provided by the embodiment of the present application. FIG. 12 is a second schematic structural diagram of the repaired display panel provided by the embodiment of the present application.

The repairing method of the display panel is provided in the embodiment, as shown in FIG. 2, and the repairing method of the display panel includes following steps: step S100, step S200, step S300, step S400, step S500, and step S600.

Step S100: providing an array substrate, wherein the array substrate comprises a first signal wiring and a second signal wiring.

Specifically, as shown in FIG. 3, an array substrate 100 is provided, the array substrate 100 includes a first signal wiring 111 and a second signal wiring 112.

Specifically, the array substrate 100 exemplified in FIG. 3 includes a base 11, a first metal layer 12, a first insulating layer 13, a semiconductor layer 14, a gate electrode insulating layer 15, a gate electrode metal layer 16, an inter-layer insulating layer 17, a source and drain electrode layer 18, a second insulating layer 19, a second metal layer 20, and a planarization layer 21 disposed in sequential stack.

Specifically, the array substrate 100 exemplified in FIG. 3 includes a plurality of transistors 300, and each of the transistors 300 includes an active area 141 formed by patterning the semiconductor layer 14, a gate electrode 161 formed by patterning the gate electrode metal layer 16, the gate electrode insulating layer 15 located between the active area 141 and the gate electrode 161, and a source electrode and a drain electrode 181 both formed by metal patterning the source and drain electrode layer 18.

Specifically, FIG. 3 illustrates a light-shielding electrode 113, the first signal wiring 111, and the second signal wiring 112 all formed by patterning the first metal layer 12, and the first signal wiring 111 and the second signal wiring 112 may also be formed with other layers of metal. FIG. 3 and FIG. 4 illustrate a connecting electrode 201 formed by patterning the second metal layer 20, and the connecting electrode 201 is connected between the drain electrode 181 and a first electrode 210. In some embodiments, the second metal layer 20 and the connecting electrode 201 may not be provided, and the first electrode 210 may be directly connected to the connecting electrode 201.

It should be noted that although FIG. 3 illustrates a layer structure of the array substrate 100, the layer structure of the array substrate 100 is not limited here. For example, the first signal wiring 111 and the second signal wiring 112 may be formed without the first metal layer 12, and can also be formed with other layers of metal. For example, the transistor 300 of the array substrate 100 is a thin film transistor with a top gate structure or a thin film transistor with a bottom gate structure, which is not limited here.

It should be noted that a material of each layer of the array substrate 100 and a material of each structure of the transistor 300 may be any materials in the prior art, which will not be repeated here.

Step S200: forming a plurality of the first electrodes of a plurality of light-emitting devices disposed in a plurality of arrays on the array substrate, wherein the first electrodes comprise a first sub-electrode and a second sub-electrode adjacent to each other; a residual electrode is generated between the first sub-electrode and the second sub-electrode, and the residual electrode is connected between the first sub-electrode and the second sub-electrode.

Specifically, as shown in FIG. 4, the first electrodes 210 of the plurality of light-emitting devices 200 disposed in the plurality of arrays are formed on the array substrate 100. The first electrodes 210 include the first sub-electrode 211 and the second sub-electrode 212 adjacent to each other. The residual electrode 213 (as shown in a dotted circle in FIG. 4) is generated between the first sub-electrode 211 and the second sub-electrode 212. The residual electrode 213 is connected between the first sub-electrode 211 and the second sub-electrode 212.

Specifically, the plurality of light-emitting devices 200 disposed in the plurality of arrays are formed on the array substrate 100, and each of the light-emitting devices 200 includes one first electrode 210.

Specifically, when a first electrode metal layer 22 is formed on the substrate 100, the first electrode metal layer 22 is patterned to form the first electrode 210 corresponding to each of the plurality of light-emitting devices 200. At this time, the residual electrode 213, caused by a short distance between adjacent first electrodes 210, such as etching residues, is formed between at least two adjacent first electrodes 210.

Specifically, in order to facilitate the description of inventive spirit of this embodiment, two adjacent first electrodes 210 with the residual electrode 213 are defined as the first sub-electrode 211 and the second sub-electrode 212, respectively.

Step S300: irradiating laser from one side of the array substrate, wherein a first through hole and a second through hole are defined respectively at corresponding parts of two ends of the residual electrode; the first through hole is defined between the first sub-electrode and the first signal wiring, and the second through hole is defined between the second sub-electrode and the second signal wiring.

Specifically, as shown in FIG. 5, the laser is irradiated from the one side of the array substrate 100, and the first through hole 501 and the second through hole 502 are defined respectively at the corresponding parts of the two ends of the residual electrode 213. The first through hole 501 is defined between the first sub-electrode 211 and the first signal wiring 111, and the second through hole 502 is defined between the second sub-electrode 212 and the second signal wiring 112.

Specifically, the laser is irradiated from one side of the array substrate 100 away from the first electrode 210, and a laser drilling process is performed to form the first through hole 501 and the second through hole 502 extending in a thickness direction of the array substrate 100 at the two ends of the residual electrode 213. The first through hole 501 is defined between the first sub-electrode 211 and the first signal wiring 111, and the second through hole 502 is defined between the second sub-electrode 212 and the second signal wiring 112.

Specifically, the first through hole 501 may penetrate the first signal wiring 111 or be disposed in contact with the first signal wiring 111. The second through hole 502 may penetrate the second signal wiring 112 or be disposed in contact with the second signal wiring 112.

Step S400: injecting a conductive material into the first through hole and the second through hole to form an extending electrode, wherein the extending electrode comprises a first extending electrode and a second extending electrode; the first extending electrode is connected to the first sub-electrode and the first signal wiring, and the second extending electrode is connected to the second sub-electrode and the second signal wiring.

Specifically, as shown in FIG. 6, the conductive material is injected into the first through hole 501 and the second through hole 502 to form the extending electrode 600. The extending electrode 600 includes the first extending electrode 601 and the second extending electrode 602; specifically, the first extending electrode 601 is formed in the first through hole 501, and the second extending electrode 602 is formed in the second through hole 502. The first extending electrode 601 is connected to the first sub-electrode 211 and the first signal wiring 111, and the second extending electrode 602 is connected to the second sub-electrode 212 and the second signal wiring 112.

Specifically, the conductive material is injected from one side of the base 11 of the array substrate 100, making the first extending electrode 601 connect to the first sub-electrode 211 and the first signal wiring 111, and making the second extending electrode 602 connect to the second sub-electrode 212 and the second signal wiring 112.

Step S500: supplying electrical signals to the first signal wiring and the second signal wiring, respectively, such that the residual electrode between the first extending electrode and the second extending electrode is melted and disconnected.

Specifically, as shown in FIG. 7, FIG. 8, and FIG. 9, the electrical signals are supplied to the first signal wiring 111 and the second signal wiring 112, respectively, making the residual electrode 213 between the first extending electrode 601 and the second extending electrode 602 melt and disconnect, and a process and a principle of melting and disconnection of the residual electrode 213 will be further introduced later.

Step S600: irradiating the first extending electrode and the second extending electrode with laser; the first extending electrode is at least partially melted to disconnect the first sub-electrode and the first signal wiring, and the second extending electrode is at least partially melted to disconnect the second sub-electrode and the second signal wiring.

Specifically, as shown in FIG. 10, the first extending electrode 601 and the second extending electrode 602 are irradiated by the laser. The first extending electrode 601 is at least partially melted to disconnect the first sub-electrode 211 and the first signal wiring 111; the second extending electrode 602 is at least partially melted to disconnect the second sub-electrode 212 and the second signal wiring 112.

Specifically, the laser is irradiated from the one side of the base 11 of the array substrate 100 to the first extending electrode 601 and the second extending electrode 602, making the first extending electrode 601 and the second extending electrode 602 melt and disconnect, respectively, so that the first sub-electrode 211 and the first signal wiring 111 are no longer electrically connected, and the second sub-electrode 212 and the second signal wiring 112 are no longer electrically connected. Therefore, after the display panel is manufactured, the electrical signals on the first signal wiring 111 and the second signal wiring 112 no longer directly affect electrical signals on the first electrodes 210 when the display panel displays.

In some embodiments, in the step S400, a melting point of a material of the extending electrode 600 is greater than a melting point of a material of the first electrodes 210.

Specifically, melting points of materials of the first extending electrode 601 and the second extending electrode 602 are greater than the melting point of the material of the first electrodes 210. Then in the step S500, when supplying the electrical signals to the first signal wiring 111 and the second signal wiring 112, respectively, it is ensured that the residual electrode 213 is melted and disconnected first, and it is ensured that a part that is melted and disconnected first is on the residual electrode 213, which ensures achievement of repairing effects.

In some embodiments, the material of the extending electrode 600 includes any one of copper, aluminum, or graphene.

Specifically, the materials of the first extending electrode 601 and the second extending electrode 602 may also include materials other than copper, aluminum, and graphene.

In some embodiments, in the step S500, a voltage difference between the first signal wiring 111 and the second signal wiring 112 is 15V to 30V.

Specifically, the voltage difference of the first signal wiring 111 and the second signal wiring 112 is great enough to make the residual electrode 213 melt and disconnect more easily in the step S500.

In some embodiments, the first signal wiring is one of a power signal wiring or a cathode signal wiring, and the second signal wiring is another one of the power signal wiring or the cathode signal wiring.

Specifically, the power signal wiring VDD is multiplexed into the first signal wiring 111, and the cathode signal wiring VSS is multiplexed into the second signal wiring 112, so it is not necessary to additionally manufacture the first signal wiring 111 and the second signal wiring 112, which simplifies a manufacturing process of the display panel. Or, the cathode signal wiring VSS is multiplexed into the first signal wiring 111, and the power signal wiring VDD is multiplexed into the second signal wiring 112, so it is not necessary to additionally manufacture the first signal wiring 111 and the second signal wiring 112, which simplifies the manufacturing process of the display panel.

Specifically, as shown in FIG. 7, FIG. 8, and FIG. 9, please combine with the step S500, the display panel includes two adjacent sub-pixels 400, the residual electrode 213 is generated between two first electrodes 210 of the two adjacent sub-pixels 400. For example, the display panel includes a red sub-pixel 400R and a green sub-pixel 400G, and the red sub-pixel 400R is adjacent to the green sub-pixel 400G; and the residual electrode 213 is generated between the first electrode 210 of the red sub-pixel 400R and the first electrode 210 of the green sub-pixel 400G. The first signal wiring 111 is the power signal wiring VDD, the second signal wiring 112 is the cathode signal wiring VSS. After the above-mentioned steps S100, S200, S300, and S400, in a repairing process of the display panel, the cathode signal wiring VSS is connected to the first electrode 210 of the red sub-pixel 400R through the second extending electrode 602; the power signal wiring VDD is connected to the first electrode 210 of the green sub-pixel 400G through the first extending electrode 601; and then the power signal wiring VDD and the cathode signal wiring VSS are supplied with electrical signals, making the residual electrode 213 melt and disconnect; and then in the step S600, the first extending electrode 601 and the second extending electrode 602 are irradiated with the laser, making the first extending electrode 601 and the second extending electrode 602 melt and disconnect, respectively. Therefore, after the display panel is manufactured, when the display panel is displaying, the power signal wiring VDD will not affect normal display of the display panel through the first extending electrode 601; and the cathode signal wiring VSS will not affect normal display of the display panel through the second extending electrode 602.

Specifically, FIG. 8 illustrates that each of the sub-pixels 400 includes a pixel driving circuit, the pixel driving circuit includes at least one driving transistor T1, at least one switching transistor T2, and at least one capacitor C. The pixel driving circuit further drives the light-emitting devices 200 to make the light-emitting devices emit light. The pixel driving circuit is electrically connected to a data signal wiring Data, a scan signal wiring Scan, the power signal wiring VDD, and the cathode signal wiring VSS. Wherein, the power signal wiring VDD is electrically connected to a source electrode of the driving transistor T1, and the power signal wiring VDD is electrically connected to the first electrodes of the light-emitting devices 200 through the driving transistor T1. Wherein, the cathode signal wiring VSS is electrically connected to cathodes of the light-emitting devices 200. The cathode signal wiring VSS provides electrical signals for the cathodes of the light-emitting devices 200.

It should be noted that the pixel driving circuit includes a structure shown in FIG. 8, but is not limited here. The pixel driving circuit can be any pixel driving circuits in the prior art, and a detailed structure of the pixel driving circuit will not be repeated here.

In some embodiments, after the step S600, the repairing method of the display panel further includes step S700. The step S700: forming a light-emitting material layer on the first electrodes, forming a second electrode of the light-emitting devices on the light-emitting material layer, and forming a package layer on the second electrode.

Specifically, as shown in FIG. 11 and FIG. 12, after the step S600, the repairing method of the display panel further includes step S700. A light-emitting material layer 24 is formed on the first electrodes 210, a second electrode 25 of the light-emitting devices 200 is formed on the light-emitting material layer 24, and a package layer 26 is formed on the second electrode 25.

Specifically, the light-emitting device 200 includes the first electrode 210 and the second electrode 25. The first electrode 210 may be an anode, the second electrode 25 may be a cathode, which are not limited here.

It should be noted that after the first electrodes 210 are manufactured, a pixel definition layer 23 may be formed, and then repaired by the above-mentioned repairing method of the display panel, or the pixel defining layer 23 may be manufactured after being repaired by the above-mentioned repairing method of the display panel, which will not be limited here.

Specifically, as mentioned above, the repairing process of the display panel is performed during a manufacturing process of the display panel 1000. That is, after the first electrodes 210 are manufactured, whether there is the residual electrode 213 between the adjacent first electrodes 210 is detected. If it is found that the residual electrode 213 generates between the adjacent first electrodes 210, any one of the above-mentioned repairing methods of the display panel will be performed for repairing.

The repairing method of the display panel is provided in the embodiment of the present application. In the manufacturing process of the display panel, after the first electrodes 210 are manufactured, adjacent two of the first electrodes 210 with the residual electrode 213 are respectively the first sub-electrode 211 and the second sub-electrode 212. The laser is irradiated from the one side of the array substrate 100, and the first through hole 501 and the second through hole 502 are defined respectively at the corresponding parts of the two ends of the residual electrode 213. The conductive materials are injected into the first through hole 501 and the second through hole 502 to form the first extending electrode 601 and the second extending electrode 602. The first extending electrode 601 is connected to the first sub-electrode 211 and the first signal wiring 111, and the second extending 602 is connected to the second sub-electrode 212 and the second signal wiring 112. The first signal wiring 111 and the second signal wiring 112 are supplied with the electrical signals, making the residual electrode 213 between the first extending electrode 601 and the second extending electrode 602 melt and disconnect. And then the first extending electrode 601 and the second extending electrode 602 are irradiated by the laser, making the first extending electrode 601 and the second extending electrode 602 melt and disconnect, respectively. The repairing method of the display panel provided in the embodiment of the present application can solve the short-circuit problem caused by the residual electrodes between the first electrodes of the adjacent light-emitting devices, thereby improving the yield of the display panel and improving the display quality of the display panel.

Second Embodiment

A display panel 1000 is provided by the embodiment, the display panel 1000 is manufactured after being repaired by any one of the repairing methods of the display panel in the above-mentioned embodiments. The display panel 1000 of the embodiment includes a residual structure after being repaired using any one of the repairing methods of the display panel in the first embodiment.

The embodiment of the present application provides the display panel 1000, and the display panel 1000 includes an array substrate 100 and a plurality of light-emitting devices 200. The plurality of light-emitting devices 200 are disposed in an array on the array substrate 100. The light-emitting device 200 includes a first electrode 210 and a second electrode 25. The second electrode 25 is disposed on one side of the first electrode away from the array substrate 100. Wherein, the array substrate 100 includes an extending electrode 600, and at least one first electrode 210 is connected to the extending electrode 600. The extending electrode 600 is disposed along a thickness direction of the array substrate 100 and extends in the array substrate. One end of the extending electrode 600 is floating.

Specifically, as shown in FIG. 12, in a manufacturing process of the display panel 1000, after being repaired by any one of the repairing methods of the display panel in the first embodiment, a first extending electrode 601 and a second extending electrode 602 (the extending electrode 600 includes a first extending electrode 601 and a second extending electrode 602) are provided between two adjacent first electrodes 210 with a residual electrode 213 before being repaired. That is, the first extending electrode 601 and the second extending electrode 602 are provided between a first sub-electrode 211 and a second sub-electrode 212. Remaining condition of the first extending electrode 601 and the second extending electrode 602 in the display panel after being repaired includes: a part of both of the first extending electrode 601 and the second extending electrode 602 remains; a part of one of the first extending electrode 601 and the second extending electrode 602 remains, and another one is completely melted by laser; both of the first extending electrode 601 and the second extending electrode 602 are completely melted by the laser.

Specifically, in general, at least one of the first extending electrode 601 and the second extending electrode 602 in the display panel remains after being repaired. Or the display panel includes a plurality of repairing parts, and at least one of the first extending electrode 601 and the second extending electrode 602 in at least one of the repairing parts remains. Therefore, at least one first electrode 210 in a repaired display panel 1000 is connected to the extending electrode 600, and the extending electrode 600 is disposed along the thickness direction of the array substrate 100 and extends in the array substrate 100. One end of the extending electrode 600 is floating.

Specifically, the extending electrode 600 is disposed along the thickness direction of the array substrate 100 and extends in the array substrate 100. That is, the extending electrode 600 extends along the thickness direction of the array substrate 100.

Specifically, preferably, the extending electrode 600 extends in a direction perpendicular to the base 11 of the array substrate 100.

In some embodiments, the extending electrode 600 includes the first extending electrode 601 and the second extending electrode 602. The first extending electrode 601 and the second extending electrode 602 are disposed between at least two adjacent first electrodes 210. The first extending electrode 601 and the second extending electrode 602 are connected to the two adjacent first electrodes 210, respectively.

Specifically, as shown in FIG. 12, in the manufacturing process of the display panel 1000, after being repaired by any one of the repairing methods of the display panel in the first embodiment, the first extending electrode 601 and the second extending electrode 602 are provided between the two adjacent first electrodes 210 with the residual electrode 213 before being repaired. That is, the first extending electrode 601 and the second extending electrode 602 are provided between the first sub-electrode 211 and the second sub-electrode 212.

Specifically, the first extending electrode 601 and the second extending electrode 602 are disposed along the thickness direction of the array substrate 100 and extend in the array substrate 100. That is, the first extending electrode 601 and the second extending electrode 602 extend along the thickness direction of the array substrate 100.

Specifically, preferably, the first extending electrode 601 and the second extending electrode 602 extend along the direction perpendicular to the base 11 of the array substrate 100.

Specifically, FIG. 12 exemplifies that the first extending electrode 601 and the second extending electrode 602 are disposed between the first electrode 210 corresponding to the red light-emitting device 200R and the first electrode 210 corresponding to the green light-emitting device 200G.

In some embodiments, one ends of both the first extending electrode 601 and the second extending electrode 602 are respectively connected to the corresponding first electrodes 210, and another ends of both the first extending electrode 601 and the second extending electrode 602 are respectively floating.

Specifically, in the step S600, after the first extending electrode 601 and the second extending electrode 602 are melted and disconnected, the one ends of both the first extending electrode 601 and the second extending electrode 602 are respectively connected to the corresponding first electrodes 210.

Specifically, FIG. 12 illustrates that one end of the first extending electrode 601 is connected to the first electrode 210, and another end is floating; FIG. 12 illustrates that one end of the second extending electrode 602 is connected to the first electrode 210, and another end is floating.

Specifically, the another ends of both the first extending electrode 601 and the second extending electrode 602 are floating, respectively, which means that the another ends of both the first extending electrode 601 and the second extending electrode 602 are not electrically connected to other electrodes or wirings.

In some embodiments, the first electrode 210 connected to the first extending electrode 601 and the first electrode 210 connected to the second extending electrode 602 correspond to light-emitting devices of different colors, respectively.

Specifically, when the residual electrode 213 is generated between the light-emitting devices of different colors, and when the light-emitting devices of different colors emit light, there will be color crosstalk, and existence of the residual electrode 213 between the light-emitting devices of different colors makes it more necessary to be repaired.

Specifically, repairing the residual electrode 213 existing between the light-emitting devices of different colors can better improve the display quality of the display panel 1000.

In some embodiments, a melting point of a material of the extending electrode 600 is greater than a melting point of a material of the first electrodes.

In some embodiments, the material of the extending electrode includes any one of copper, aluminum, or graphene.

In the display panel 1000 of the present embodiment, in the display panel 1000 repaired by the repairing method of the display panel in the first embodiment, the first extending electrode 601 and the second extending electrode 602 are disposed between at least two adjacent first electrodes 210. The first extending electrode 601 and the second extending electrode 602 are connected to the two adjacent first electrodes 210, respectively. The first extending electrode 601 and the second extending electrode 602 are disposed along the thickness direction of the array substrate 100 and extend in the array substrate 100. The repaired display panel 1000 eliminates the residual electrodes 213 between the first electrodes 210 of the adjacent light-emitting devices 200, and solves the short-circuit problem caused by the residual electrodes 213, thereby improving the yield of the display panel 1000 and improving the display quality of the display panel 1000.

The display panel and the repairing method of the display panel provided by the embodiments of the present application have been described in detail above. The principles and implementations of the present application are described by using specific examples in this paper. The description of the above-mentioned embodiment is only used to help understand method of the present application and its core idea; meanwhile, for those skilled in the art, according to the idea of the present application, there will be changes in the specific embodiment and a scope of the present application. In conclusion, content of this specification should not be construed as a limitation on the present application.

What is claimed is:

1. A display panel, comprising:

an array substrate; and a plurality of light-emitting devices disposed in an array on the array substrate, the light-emitting devices comprising a plurality of first electrodes and a second electrode, the second electrode disposed on one side of the first electrodes away from the array substrate; wherein the array substrate comprises an extending electrode, and at least one of the first electrodes is connected to the extending electrode; the extending electrode is disposed along a thickness direction of the array substrate and extends in the array substrate, and one end of the extending electrode is floating, wherein the extending electrode comprises two disconnected parts, so that no electrical connection is presented between the first electrodes and the end of the extending electrode which is floating, wherein the extending electrode comprises a first extending electrode and a second extending electrode; the first extending electrode and the second extending electrode are disposed between at least two adjacent first electrodes, and the first extending electrode and the second extending electrode are connected to adjacent two of the first electrodes, respectively.

2. The display panel as claimed in claim 1, wherein at least one of the first electrodes connected to the first extending electrode and at least one of the first electrodes connected to the second extending electrode correspond to light-emitting devices of different colors, respectively.

3. The display panel as claimed in claim 1, wherein a melting point of a material of the extending electrode is greater than a melting point of a material of the first electrodes.

4. The display panel as claimed in claim 3, wherein the material of the extending electrode comprises any one of copper, aluminum, or graphene.

5. A repairing method of a display panel, comprising following steps:

step S100: providing an array substrate, wherein the array substrate comprises a first signal wiring and a second signal wiring;

step S200: forming a plurality of first electrodes of a plurality of light-emitting devices disposed in a plurality of arrays on the array substrate, wherein the first electrodes comprise a first sub-electrode and a second sub-electrode adjacent to each other; a residual electrode is generated between the first sub-electrode and the second sub-electrode, and the residual electrode is connected between the first sub-electrode and the second sub-electrode;

step S300: irradiating laser from one side of the array substrate to form a first through hole and a second through hole, wherein the first through hole and the second through hole are defined respectively at corresponding parts of two ends of the residual electrode; a portion of the first through hole is defined between the first sub-electrode and the first signal wiring, and a portion of the second through hole is defined between the second sub-electrode and the second signal wiring, and another portions of the first through hole and the second through hole both goes through a base of the array substrate;

step S400: injecting a conductive material into the first through hole and the second through hole to form an extending electrode, wherein the extending electrode comprises a first extending electrode and a second extending electrode; the first extending electrode is connected to the first sub-electrode and the first signal wiring, and the second extending electrode is connected to the second sub-electrode and the second signal wiring, so that the first signal wiring, the first extending electrode, the first sub-electrode, the residual electrode, the second sub-electrode, the second extending electrode, and the second signal wiring are electrically connected in sequence; wherein a melting point of a material of the extending electrode is greater than a melting point of a material of the first electrodes;

step S500: supplying electrical signals to the first signal wiring and the second signal wiring, respectively, such that the residual electrode between the first extending electrode and the second extending electrode is melted and disconnected; wherein a voltage difference of the electrical signals to the first signal wiring and the second signal wiring is presented to make the residual electrode melt and disconnect; and step S600: irradiating the first extending electrode and the second extending electrode with laser, wherein the first extending electrode is at least partially melted to disconnect the first sub-electrode and the first signal wiring, and the second extending electrode is at least partially melted to disconnect the second sub-electrode and the second signal wiring.

6. The repairing method of the display panel as claimed in claim 5, wherein the material of the extending electrode comprises any one of copper, aluminum, or graphene.

7. The repairing method of the display panel as claimed in claim 5, wherein in the step S500, a voltage difference between the first signal wiring and the second signal wiring is 15V to 30V.

8. The repairing method of the display panel as claimed in claim 5, wherein the first signal wiring is one of a power signal wiring or a cathode signal wiring, the second signal wiring is another of the power signal wiring and the cathode signal wiring.

9. The repairing method of the display panel as claimed in claim 5, wherein after the step S600, the method further comprises following step:

step S700: forming a light-emitting material layer on the first electrodes, forming a second electrode of the light-emitting devices on the light-emitting material layer, and forming a package layer on the second electrode.

10. The display panel as claimed in claim 1, wherein the array substrate comprises a base and a transistor layer, and the transistor layer is disposed on the base; the array substrate is provided with a through hole, the through hole goes through the base and further extends into the transistor layer, and the extending electrode is filled in the through hole.

11. The display panel as claimed in claim 1, wherein the array substrate further comprises a first insulating layer, the one end of the extending electrode is in direct contact with the first insulating layer.

* * * * *